(12) United States Patent
Fink

(10) Patent No.: US 6,980,433 B2
(45) Date of Patent: Dec. 27, 2005

(54) DATA CENTER COOLING SYSTEM

(75) Inventor: James Fink, Exeter, RI (US)

(73) Assignee: American Power Conversion Corporation, West Kingston, RI (US)

( * ) Notice: Subject to any disclaimer, the term of this patent is extended or adjusted under 35 U.S.C. 154(b) by 0 days.

(21) Appl. No.: 11/020,881

(22) Filed: Dec. 23, 2004

(65) Prior Publication Data
US 2005/0099770 A1 May 12, 2005

Related U.S. Application Data

(63) Continuation of application No. 10/391,971, filed on Mar. 19, 2003, now Pat. No. 6,859,366.

(51) Int. Cl.[7] .............................................. H05K 7/20
(52) U.S. Cl. ...................... 361/690; 361/691; 361/695; 165/121; 62/414
(58) Field of Search ................................ 361/678, 690, 361/691–698, 701, 727–729; 165/80.3, 80.4, 165/80.5, 104.19, 121, 104.33, 104.34, 122, 165/903; 174/15.1, 16.1; 454/184, 186; 62/259.2, 62/414, 418, 419, 263, 89; 29/729, 854, 592.1

(56) References Cited

U.S. PATENT DOCUMENTS 6,034,873 A * 3/2000 St.ang.hl et al. ............ 361/701
6,374,627 B1 * 4/2002 Schumacher et al. ...... 62/259.2
6,574,104 B2 * 6/2003 Patel et al. .................. 361/695
6,672,955 B2 * 1/2004 Charron ...................... 454/184
6,862,179 B2 * 3/2005 Beitelmal et al. ........... 361/687

FOREIGN PATENT DOCUMENTS

JP 02003166729 A * 6/2003 ............ F24F 3/044

* cited by examiner

Primary Examiner—Michael Datskovskiy
(74) Attorney, Agent, or Firm—Mintz, Levin, Cohn, Ferris, Glovsky and Popeo, P.C.; A. Jason Mirabito; Shane H. Hunter

(57) ABSTRACT

A modular data center includes a plurality of racks, each of the racks having a front face and a back face, wherein the plurality of racks is arranged in a first row and a second row, such that the back faces of racks of the first row are facing the second row, and the back faces of the racks of the second row are facing the first row, a first end panel coupled between a first rack of the first row and a first rack of the second row, the first end panel having a bottom edge and a tope edge, a second end panel coupled between a second rack of the first row and a second rack of the second row, the second end panel having a top edge and a bottom edge, and a roof panel coupled between the top edge of the first panel and the top edge of the second panel.

13 Claims, 3 Drawing Sheets

DATA CENTER COOLING SYSTEM

CROSS-REFERENCE TO RELATED APPLICATIONS

This application is a continuation application under 37 CFR §1.53(b) of U.S. Ser. No. 10/391,971, (U.S. Pat. No. 6,859,366), filed on Mar. 19, 2003, and entitled, "Data Center Cooling System," which is assigned to the assignee of this application and is herein incorporated by reference in its entirety.

FIELD OF THE INVENTION

Embodiments of the present invention are directed to cooling of rack-mounted devices, and more particularly to a data center infrastructure having a cooling system.

BACKGROUND OF THE INVENTION

Electronic equipment racks generally are designed to receive a number of electronic components arranged vertically in the rack, mounted on shelves, and/or to front and rear mounting rails. The electronic equipment may include, for example, printed circuit boards, communications equipment, computers, including computer servers, or other electronic components.

Electronic equipment housed in racks produces a considerable amount of heat, which undesirably affects performance and reliability of the electronic equipment. Often the heat produced by the rack-mounted components is not evenly distributed in the racks. Temperature gradients causing elevated inlet temperatures at tops of racks, for example, reduce equipment reliability substantially. Equipment reliability may be reduced by as much as half the reliability of specific equipment function for each 10° F. rise in temperature. Accordingly, rack-mounted computer systems typically require effective cooling systems to maintain operational efficiency. Cooling can be accomplished by introducing cooled air into an equipment rack causing the air to flow through equipment in the rack and exit the rack at an increased temperature, thereby removing some of the heat. The heat removed from the rack is typically returned into the room containing the racks and the entire room is cooled using a relatively large air conditioning system.

SUMMARY OF THE INVENTION

A first aspect of the present invention is directed to a modular data center. The modular data center includes a plurality of racks, each of the racks having a front face and a back face, wherein the plurality of racks is arranged in a first row and a second row, such that the back faces of racks of the first row are facing the second row, and the back faces of the racks of the second row are facing the first row. The data center also includes a first end panel coupled between a first rack of the first row and a first rack of the second row, the first end panel having a bottom edge and a tope edge. Further, the data center includes a second end panel coupled between a second rack of the first row and a second rack of the second row, the second end panel having a top edge and a bottom edge, and a roof panel is included to couple between the top edge of the first panel and the top edge of the second panel.

The modular data center can be designed so that the roof panel is coupled to a top portion of at least one rack of the first row and to a top portion of at least one rack of the second row, such that the roof panel, the first end panel, the second end panel, and the first and second rows of racks form an enclosure around an area between the first row of racks and the second row of racks. The plurality of racks can further include cooling equipment that draws air from the area, cools the air and returns cooled air out of the front face of one of the racks. At least one of the first end panel and the second end panel can include a door. Further, at least a portion of the roof panel can be translucent. The modular data center can have at least one rack that includes an uninterruptible power supply to provide uninterrupted power to equipment in at least one other rack of the plurality of racks. The first row of racks in the modular data center can be substantially parallel to the second row. In addition, the modular data center can be designed such that one of the plurality of racks includes cooling equipment that draws air from an area between the first row and the second row, cools the air and returns cooled air out of the front face of one of the racks.

Another aspect of the present invention is directed to a method of cooling electronic equipment contained in racks in a data center. The method includes arranging the racks in two rows, including a first row and a second row that is substantially parallel to the first row, with a back face of at least one of the racks of the first row facing towards a back face of at least one of the racks of the second row. The method also includes forming an enclosure around an area between the first row and the second row, and drawing air from the area into one of the racks and passing the air out of a front face of the one of the racks.

The method can include a further step of cooling the air drawn into the one of the racks prior to passing the air out of the front face. The step of forming an enclosure may include coupling first and second side panels and a roof panel between the first row and the second row. At least one of the first side panel and the second side panel may include a door and the roof panel can include a translucent portion. Additionally, the method can include using an uninterruptible power supply to provide power to equipment in the racks.

Yet another aspect of the present invention is directed to a modular data center that includes a plurality of racks, each of the racks having a front face and a back face, wherein the plurality of racks is arranged in a first row and a second row, such that the back faces of the racks of the first row are facing the second row, and the back faces of the racks of the second row are facing the first row. The modular data center further includes means for enclosing a first area between the first row and the second row, and means for drawing air from the enclosed area, cooling the air, and returning cooled air to a second area.

The means for drawing air can further include means for passing cooled air through the front face of one of the racks. The modular data center can also be comprised of means for providing uninterruptible power to equipment in the racks. Access means for allowing access into the first area may also be a design feature of the modular data center.

The invention will be more fully understood after a review of the following figures, detailed description and claims.

BRIEF DESCRIPTION OF THE FIGURES

For a better understanding of the present invention, reference is made to the figures which are incorporated herein by reference and in which.

DETAILED DESCRIPTION OF THE INVENTION

Embodiments of the invention provide a data center infrastructure having a cooling system for cooling rack-mounted electronic equipment. Embodiments of the invention provide a modular data center for rack-mounted equipment, wherein the modular data center provides power distribution, cooling and structural support for the rack-mounted equipment. The power distribution unit and cooling is provided in some embodiments using redundant systems to prevent downtime due to electrical or mechanical failures. As understood by those skilled in the art, other embodiments are within the scope of the invention, such as embodiments used to provide infrastructure for equipment other than electronic equipment.

A system for providing power distribution for rack-mounted equipment which can be used with embodiments of the present invention is described in U.S. patent application Ser. No. 10/038,106, entitled, "Adjustable Scalable Rack Power System and Method," which is herein incorporated by reference.

Figure 1:
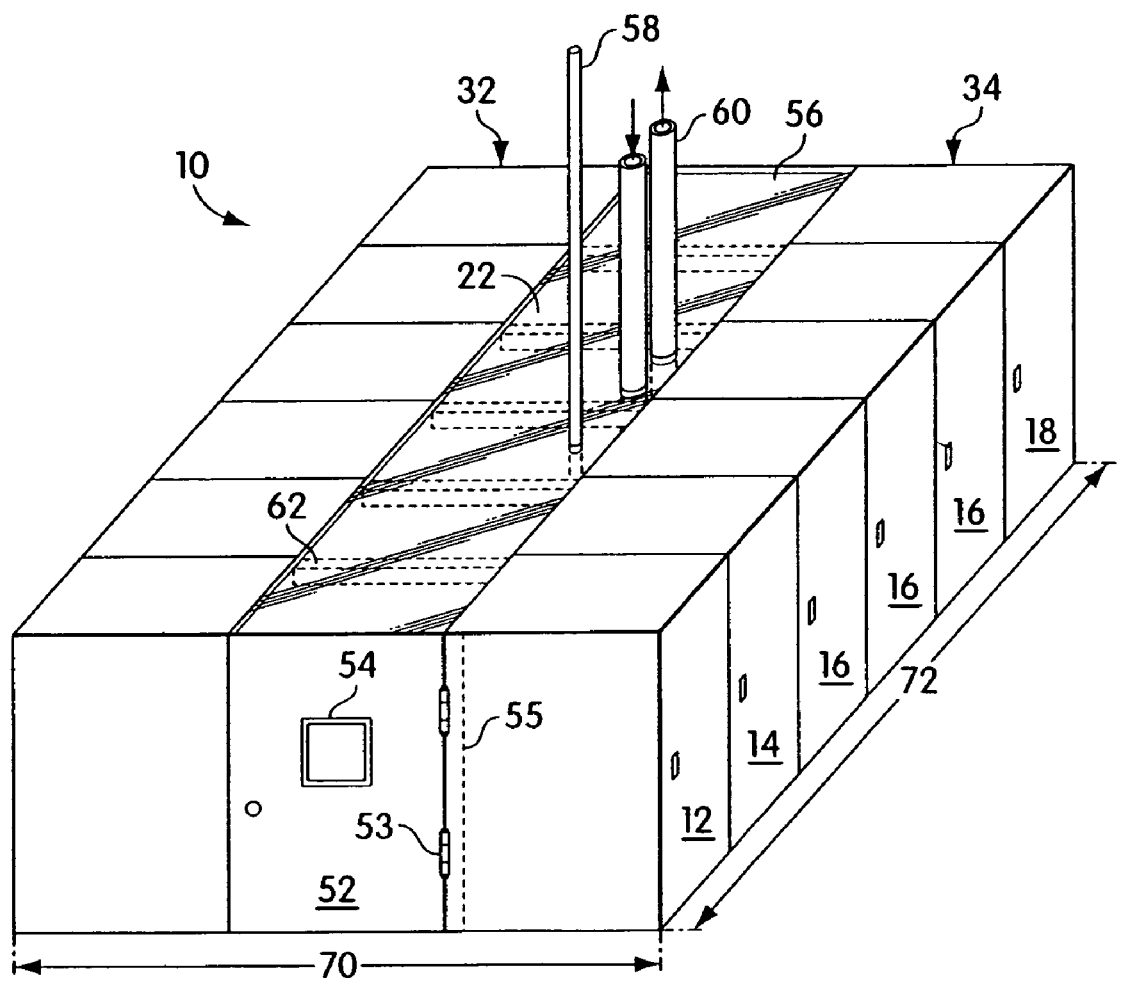
FIG. 1 is a perspective view of a modular data center cooling system for rack-mounted equipment in accordance with one embodiment of the invention.

Referring to FIG. 1, a perspective view of a modular data center 10 is shown. The modular data center 10 includes a power distribution unit 14, a power protection unit 12, a floor mounted cooling unit 16, equipment racks 18, and a hot room 22. The modular data center 10 also has a door 52 having a window 54, a roof 56, a cold water supply and return 60, and a voltage feed 58. The data center 10 is a modular unit comprised of the power distribution unit 14, the power protection unit 12 the floor mounted cooling unit 16, and equipment racks 18 positioned adjacent to each other to form a row 32 and a row 34. Row 32 and row 34 are substantially parallel. The power distribution unit 14 and the power protection unit 12 can be located directly adjacent to one another, and can be located at the end of one of the rows. The floor-mounted cooling unit 16 may be located and positioned adjacent to the power distribution unit 14. Remaining enclosures forming the at least one additional row in the data center 10 are equipment racks 18. The hot room 22 is located between row 32 and row 34, and rows 32 and 34 comprise two of the perimeter walls of the modular data center 10.

The power distribution unit 14 typically contains a transformer, and power distribution circuitry, such as circuit breakers, for distributing power to each of the racks in the modular data center 10. The power distribution unit 14 provides redundant power to the racks 18 and can monitor the total current draw. An uninterruptible power supply can provide uninterruptible power to the power distribution unit 14. Preferably, the power distribution unit 14 includes a 40 kW uninterruptible power supply having N+1 redundancy, where the ability to add another power module provides N+1 redundancy. In one embodiment of the invention, input power to the power distribution unit 14 is received through the top of the rack from a voltage feed 58. In one embodiment, the voltage feed 58 is a 240 volt feed coupled to the power distribution unit 14 that enters through the roof panel 56. Alternatively, the input power may be received from underneath the rack, as through a raised floor, or through the back of the rack.

The power protection unit 12 provides redundant power protection for centralized information technology equipment, as is contained in the equipment racks 18. The power protection unit 12 can have individual power modules and battery modules that can be individually added or removed to accommodate different load requirements. The use of multiple power modules and battery modules provides redundancy by allowing continued operation despite the failure of any one power module or battery module. For example, the power protection unit can include a Symmetra PX® scalable, uninterruptible power supply having a three-phase input and a three-phase output, available from American Power Conversion Corporation, of West Kingston, R.I., or the power protection unit can include one of the uninterruptible power supplies described in U.S. Pat. No. 5,982,652, titled, "Method and Apparatus for Providing Uninterruptible Power," which is incorporated herein by reference.

The floor mounted cooling unit 16 provides heat removal by use of a chilled water supply, which enters the unit through supply line 60. Alternatively, the cooling units can provide heat removal using DX compressorized cooling via use of a direct expansion refrigerant-based unit, which can be in the unit itself. The cooling unit contains a primary chilled water coil and secondary direct expansion coil within the same frame. The cooling unit can be configured for air, water or glycol use. Cooled air can be released through the bottom of the unit or the top of the unit. In one embodiment of the invention, cool air is released from the cooling unit 16 out its front face, so that the air flow is from the back of the rack and out the front of the rack. The cooling unit 16 can further be configured as one, two or three modules. In the embodiment shown in FIG. 1, a three-module cooling unit is used.

In the embodiment of FIG. 1, each of row 32 and row 34 is comprised of six racks. In embodiments of the invention, the number of racks and the function of the equipment in the racks can vary. In one embodiment of the invention, the racks 18 are modified standard 19 inch racks, such as those available from American Power Conversion Corporation of West Kingston, R.I., under the trade name NETSHELTER VX Enclosures®.

The back face of each of the power distribution unit 14, the power protection unit 12, the floor mounted cooling unit 16, and the equipment racks 18 faces the interior of the modular data center 10, or the hot room 22. Essentially, the back faces of the racks in row 32 face the back faces of the racks in row 34. In one embodiment, the equipment racks 18 have their rear doors removed so that each rack 18 remains open to the inside of the hot room 22. In the embodiment shown, the modular data center 10 contains seven equipment racks 18. Alternatively, in another embodiment, six equipment racks 18 complete the rows, but more than seven equipment racks 18 can complete the rows contained in the data center 10 and can be adjacent to one another or adjacent to other enclosures in the data center 10, such as the power distribution unit 14, the power protection unit 12, or the floor mounted cooling unit 16.

The door 52 located at the end of the row of racks is attached with hinges 53 to a detachable frame 55. The detachable frame 55 is located behind the power protection unit 12. The detachable frame may be positioned behind any one of the power protection unit 12, the power distribution unit 14, or the equipments racks 18, depending on which of the units are positioned at the end of a row in the data center 10. The detachable frame 55 allows the door 52 to be quickly removed for replacement of the power protection unit 12 if necessary. The hot room is accessible by the door 52 and can be monitored through the observation window 54. Preferably, a door 52 is located at each end of the hot room 22. Generally, the door 52 is a 2×36 inch insulated, lockable steel door having an insulated observation window 54.

The cold water supply and return 60 can enter the hot room through supply pipes into the roof 56 or directly into the roofs of the racks. The voltage feed 58 can also enter through the roof 56 or through the roofs of the racks. Alternatively, the cold water supply and return 60 and the voltage feed 58 enter the hot room through a raised floor on which the modular data center rests or from another location outside of the room and into the racks, such as into the sides of the racks.

The roof panel 56 is preferably a semi-transparent plexiglass roof panel supported by steel supports 62 that are positioned at intervals along the length 72 of the data center 10. The roof 56 extends to cover the top of the hot room 22 located in the middle of the rows of racks. The roof 56 can be easily detachable to allow for removal of racks 18 or the power protection unit 12 when necessary. A roof panel 56 constructed of semi-transparent plexiglass allows room light to enter the space defining the hot room 22. Additionally, the plexiglass roof 56 is preferably substantially airtight.

The hot room 22 is completely enclosed and has walls formed by the backside of the racks 18 and walls comprised of the door 52 attached at each end of the hot room 22. Alternatively, panels without doors can be the walls that complete the hot room. The hot room 22 is a substantially airtight passageway when the roof panel 56 is in place. Thus, the modular data center 10 is an enclosed computer infrastructure defined on its outside perimeter by the front face of each of the racks 18, power protection unit 12, power distribution unit 14, and cooling unit 16, and having a hot room 22 in its midsection. The outside walls of the hot room formed by the doors 52 are a portion of two of the outside walls of the modular data center 10.

Figure 2:
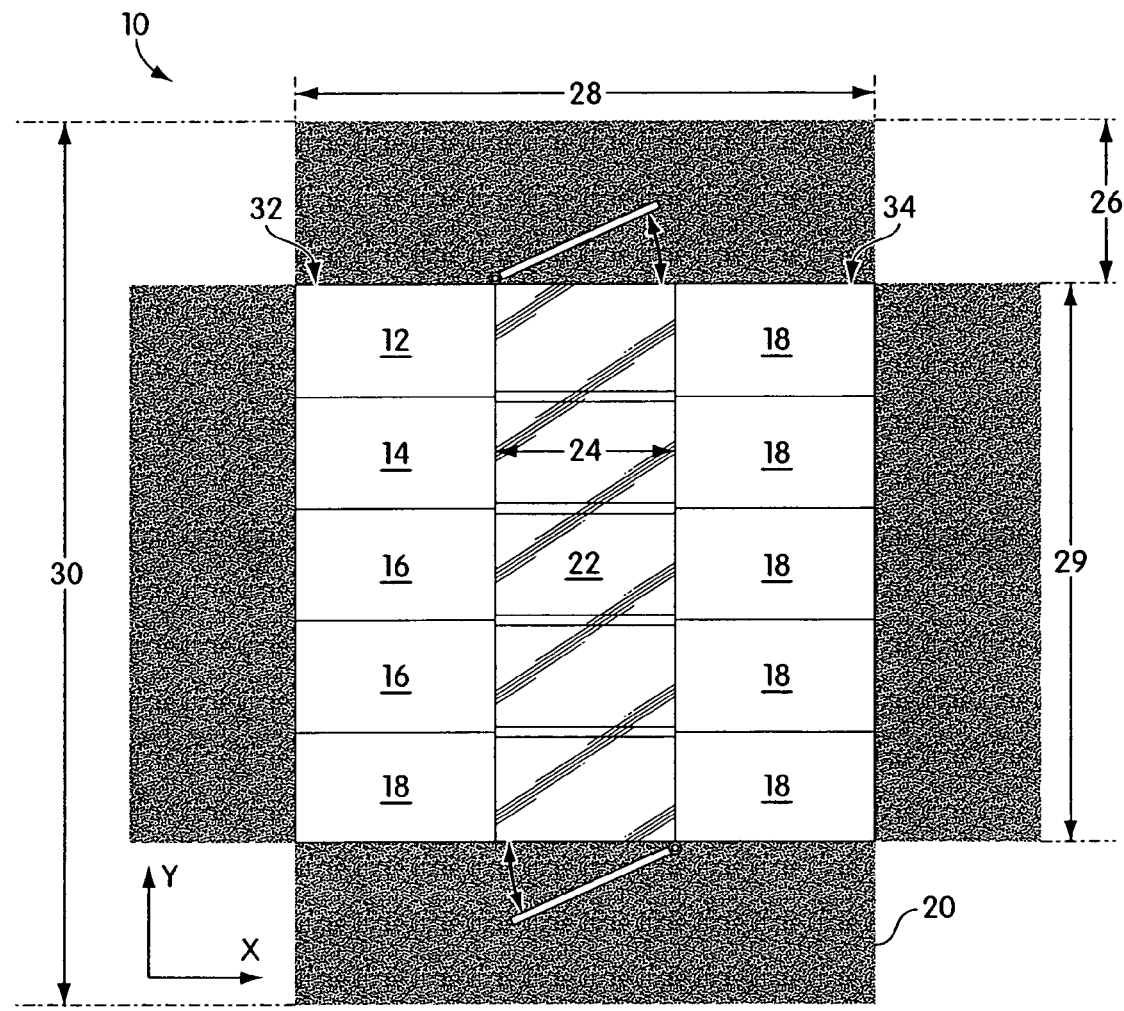
FIG. 2 is a top view of another modular data system, similar to the system of FIG. 1.

Referring to FIG. 2, a top view of a modular data center 10 in one embodiment of the invention is shown. The modular data center of FIG. 2 is similar to that of FIG. 1, but has five racks in each of row 32 and row 34, rather than the six racks in each row of FIG. 1. With like numbers referring to like embodiments, the modular data center 10 of FIG. 2 is comprised of the power distribution unit 14, the power protection unit 12, the floor mounted cooling unit 16, the equipment racks 18, and the hot room 22. The power protection unit 12 is positioned directly adjacent to one side of the power distribution unit 14, while a floor-mounted cooling unit 16 is positioned on the other side of the power distribution unit. A service clearance area 20 surrounds the modular data center 10. In FIG. 2, an embodiment of the invention is shown having six equipment racks 18 and a cooling unit 16 having two modules.

The dimensions of the modular data center 10 depend on the number of racks included in each of the rows of racks. For example, and referring again to FIG. 1, a data center 10 having six equipment racks 18 can have a width of 120", indicated by arrow 28, a length of 120", indicated by arrow 29, and a height of 36", indicated by arrow 24. The height 24 of the data center can be 36", while the service clearance is preferably 36" in width 26. With the inclusion of the service clearance 20, the floor surface area for the data center 10 is, preferably, a length 30 of 192" and a width 30 of 192". Alternatively, and referring to FIG. 2, a data center 10 having seven equipment racks 18 can have a width of 120" and a length of 144", while the height of the data center 10 is 36". With the inclusion of the service clearance 20, the floor surface area for an alternate data center is 192" by 216". The dimensions of the modular data center are given only as examples, but can vary significantly depending upon the type and size of racks used to design the data center.

The modular data center 10 is operational when provided with a source of chilled water 60 and a voltage feed 58. The data center can include a number of different power input designs, but is preferably a 40 kW design, allowing 6.7 kW/rack in a system having six equipment racks 18, or 5.7 kW/rack in a system having seven equipment racks 18, for example. Cold water enters the floor mounted cooling units 16 via supply lines 60. A common supply line 60 can provide cold water to one or more cooling units simultaneously, as the cooling units 16 are connected to the common supply 60 with flexible hose that is easily disconnected.

The modular data center 10 provides cooling for equipment in the data center as follows. Air from the room, or ambient air, filters through the front of the racks 18 to cool the equipment stored in the racks 18. Air enters through the front of the racks 18 and is expelled out of the backside of the racks 18. As the air passes through the equipment racks 18, the temperature of the air rises. The respectively warmer air is expelled into the hot room 22. The hot room 22 contains the warm air and prevents the warm air from mixing with air in the surrounding room. The cooling unit 16 draws warm air from the hot room and return cool air to the room outside the data center 10. The warm air enters the cooling units 16 directly from the hot room 22. The cold water supply 60 acts within the cooling unit to lower the temperature of the air, and the cooled air is then released into the surrounding area. The air is recycled to the surrounding room at a substantially cooled temperature. For example, the cooling unit 16 generally receives air from the hot room at 95° F. and cools it to a temperature of approximately 72° F. before it is released into the area surrounding the data center 10. The floor mounted cooling unit 16 operates at substantially higher supply and return temperatures, allowing realization of high capacity without latent heat removal.

Figure 3:
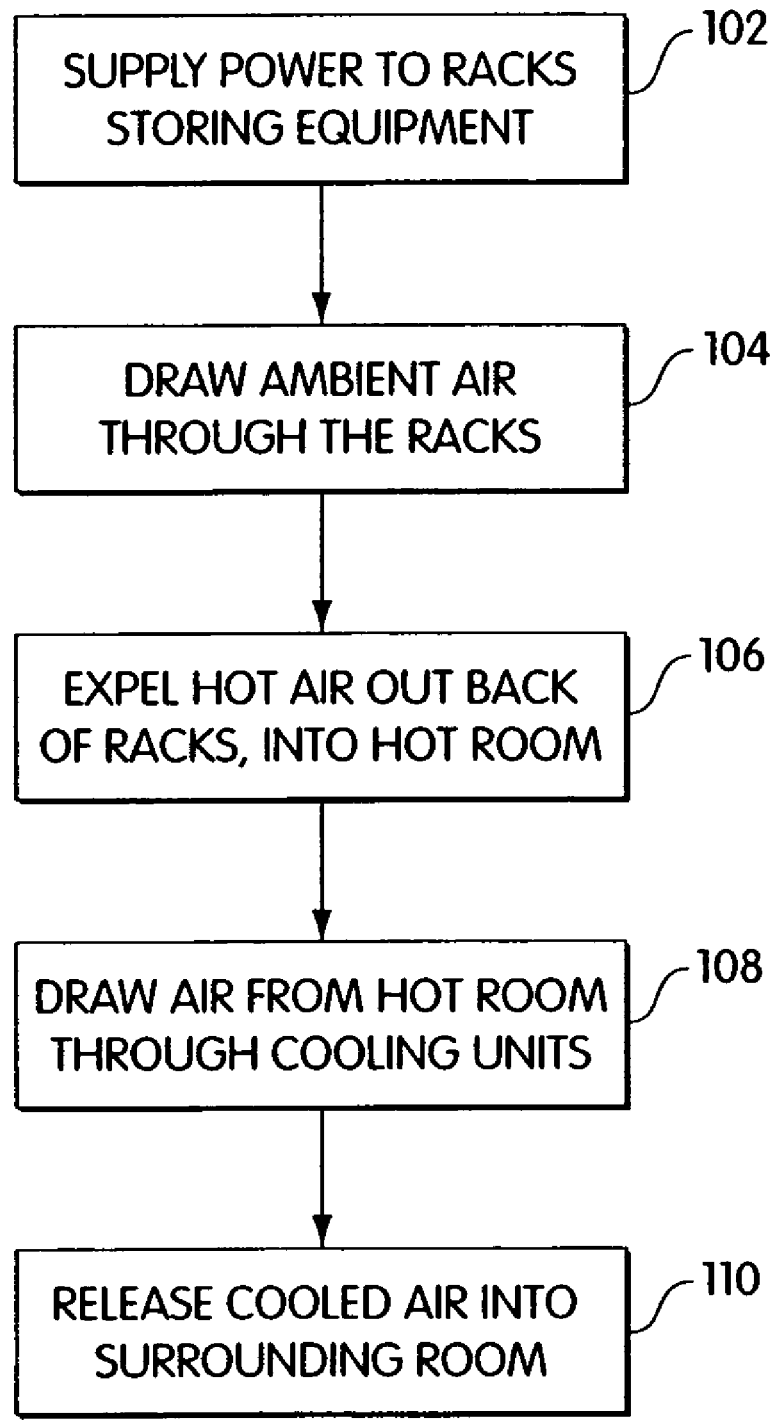
FIG. 3 is a block flow diagram of a process of cooling equipment mounted in modular data centers in one embodiment of the invention.

Referring to FIG. 3, with further reference to FIGS. 1–2, the data center 10 is configured to perform a process of cooling equipment stored in enclosed racks using an infrastructure having independent power and coolant supplies. The process 100 includes the stages shown, although the process 100 may be altered, e.g., by having stages added, deleted, or moved relative to the stages shown.

The process 100 of FIG. 3 includes stage 102, wherein power is supplied from a power distribution unit to a plurality of equipment racks 18. The equipment racks 18 may contain a variety of electronic equipment that requires a consistent power supply to avoid system downtime. A voltage feed 58 is connected to the power distribution unit 14, and a power protection unit 12 is installed adjacent to the power distribution unit 14 to ensure redundant power supply.

At stage 104, the racks 18 draw cool air from the surrounding room through the front face of the racks 18. There may, for example, be an air distribution unit within the racks and/or within equipment contained in the racks that draws the room air into the rack 18 and distributes the air throughout the rack to cool components contained in the rack. As the air passes through the rack 18, the air increases in temperature.

At stage 106, the racks 18 expel the air at an increased temperature into the hot room 22. The air is expelled out of the backside of the racks 18. As described above, in one embodiment, the racks 18 do not have rear doors. In other embodiments, rear doors may be included on the racks with the warm air being expelled into the hot room through vents in the doors. Air is held in the hot room 22 at an increased temperature and mixing of the warm air with the surrounding ambient air is prevented.

At stage 108, the cooling unit draws the warm air from the hot room 22. The cooling unit 16 uses the cold water from the cold water supply 60 to cool the air from the hot room. At stage 110, the cooled air is released from the cooling unit into the surrounding room, which completes the cooling cycle. The air in the surrounding room is then drawn into the racks 18 once again, and the cycle continues.

Other embodiments are within the scope and spirit of the appended claims. For example, air could be forced up through the equipment racks 18. Air moved through the racks 18 could be of varying temperatures, including hot air. The data center 10 may be configured to distribute gases other than air. Additionally, a refrigerant or other coolant may be used rather than cold water. Further, a controller can be coupled to the data center 10 to monitor air temperatures and flow rates, as well as power supply so that each rack is provided adequate power consistently. A data center may contain a single equipment rack 18 having a single cooling unit 16 creating an individual data center, whereby power is distributed to a single data center 10 or multiple single-rack data centers simultaneously.

Further, in embodiments of the present invention, the roof over the hot area may include a number of fans that are controlled to exhaust air from the hot area in the event of a failure of an air conditioning unit in the modular data center, and/or when air temperature in the hot area exceeds a predetermined limit.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A modular data center comprising:
   a plurality of racks, each of the racks having a front face and a back face, wherein the racks are arranged in a first row and a second row such that the back faces of the racks of the first row face the back faces of the racks of the second row and wherein the racks are configured to accept air through the front faces of the racks and expel the air through the back faces of the racks;
   a cooling unit positioned in one of the first row and the second row, the cooling unit configured to draw air through a back face of the cooling unit and deliver cooled air through a front face of the cooling unit to the front faces of the plurality of racks;
   an enclosure to collect air expelled from the plurality of racks, wherein the first row and the second row comprise a portion of the enclosure that collects the expelled air.

2. The modular data center of claim 1, wherein the enclosure further comprises:
   a first end panel coupled between a first rack of the first row and a first rack of the second row, the first end panel having a bottom edge and a top edge;
   a second end panel coupled between a second rack of the first row and a second rack of the second row, the second end panel having a bottom edge and a top edge; and
   a roof panel coupled between the top edge of the first end panel and the top edge of the second end panel.

3. The modular data center of claim 2, wherein the cooling unit draws air from the enclosure that collects the expelled air, cools the air and delivers cooled air out of the front face of the cooling unit.

4. The modular data center of claim 2, wherein at least one of the first end panel and the second end panel includes a door.

5. The modular data center of claim 2, wherein at least a portion of the roof panel is translucent.

6. The modular data center of claim 1, wherein at least one of the racks includes an uninterruptible power supply to provide uninterrupted power to equipment in at least one other rack of the plurality of racks.

7. The modular data center of claim 1, wherein the first row is substantially parallel to the second row.

8. A system for restricting mixing of air in a data center having a plurality of racks, each of the racks having a front face and a back face, wherein the racks are arranged in a first row and a second row such that the back faces of the racks of the first row face the back faces of the racks of the second row, the system comprising:
   a cooling unit to deliver air to the front faces of the plurality of racks; and
   an enclosure for collecting air released from the back faces of the plurality of racks, the enclosure configured to substantially contain the air in an area between the first row and the second row and having a roof panel coupled to the first row of racks and the second row of racks configured to span a distance between the first row of racks and the second row of racks.

9. The system of claim 8 wherein the enclosure further comprises a first end panel coupled between a first rack of the first row and a first rack of the second row and a second end panel coupled between a second rack of the first row and a second rack of the second row.

10. The system of claim 9 wherein at least one of the first end panel and the second end panel includes a door.

11. The system of claim 8 wherein at least a portion of the roof panel is translucent.

12. The system of claim 8 wherein at least one of the plurality of racks includes an uninterruptible power supply to provide uninterrupted power to equipment in at least one other rack of the plurality of racks.

13. The system of claim 8 wherein the air collected in the enclosure comprises the supply air for the cooling unit to deliver to the front faces of the plurality of racks.

* * * * *